United States Patent
Park

(10) Patent No.: US 11,113,145 B2
(45) Date of Patent: Sep. 7, 2021

(54) MEMORY DEVICE, SEMICONDUCTOR DEVICE, AND SEMICONDUCTOR SYSTEM

(71) Applicant: SK hynix Inc., Icheon (KR)

(72) Inventor: Chang Hyun Park, Seoul (KR)

(73) Assignee: SK hynix Inc., Icheon (KR)

( * ) Notice: Subject to any disclaimer, the term of this patent is extended or adjusted under 35 U.S.C. 154(b) by 172 days.

(21) Appl. No.: 16/279,917

(22) Filed: Feb. 19, 2019

(65) Prior Publication Data

US 2019/0258543 A1  Aug. 22, 2019

(30) Foreign Application Priority Data

Feb. 19, 2018 (KR) .................. 10-2018-0019326

(51) Int. Cl.
| | | |
|---|---|---|
| *G11C 29/00* | (2006.01) | |
| *G06F 11/10* | (2006.01) | |
| *G11C 29/52* | (2006.01) | |
| *G06F 3/06* | (2006.01) | |
| *G06F 12/10* | (2016.01) | |

(52) U.S. Cl.
CPC ........ *G06F 11/1068* (2013.01); *G06F 3/0616* (2013.01); *G06F 3/0653* (2013.01); *G06F 3/0659* (2013.01); *G06F 3/0673* (2013.01); *G06F 12/10* (2013.01); *G11C 29/52* (2013.01); *G06F 2212/1036* (2013.01)

(58) Field of Classification Search
CPC .. G06F 11/1068; G06F 3/0616; G06F 3/0653; G06F 3/0659; G06F 3/0673; G06F 12/10; G06F 2212/1036; G11C 29/52
USPC ........................... 714/764, 766, 762
See application file for complete search history.

(56) References Cited

U.S. PATENT DOCUMENTS

| | | | |
|---|---|---|---|
| 9,081,701 B1* | 7/2015 | Northcott | G06F 11/108 |
| 9,298,606 B2 | 3/2016 | Ramanujan | |
| 9,569,306 B1* | 2/2017 | Camp | G06F 11/108 |
| 2018/0067850 A1* | 3/2018 | Kawamura | G06F 12/16 |
| 2018/0232177 A1 | 8/2018 | Park | |
| 2019/0163592 A1* | 5/2019 | Camp | G06F 3/0655 |

FOREIGN PATENT DOCUMENTS

| | | |
|---|---|---|
| KR | 100282679 B2 | 5/1998 |
| KR | 201300019891 A | 2/2013 |

* cited by examiner

*Primary Examiner* — Christine T. Tu

(57) ABSTRACT

A memory device includes a plurality of pages. Each page includes a data region configured to store data, an error correction code (ECC) region configured to store ECC data that is used to detect and correct one or more errors occurring in the data stored in the data region, and a metadata region configured to store a write count of a corresponding page.

7 Claims, 12 Drawing Sheets

| AMT1 | |
|---|---|
| WR_ADD | ADD |
| LOG_ADD1 | PHY_ADD1 |
| LOG_ADD2 | PHY_ADD2 |
| ⋮ | ⋮ |

| AMT2 | |
|---|---|
| WR_ADD | ADD |
| LOG_ADD1 | PHY_ADD3 |
| LOG_ADD2 | PHY_ADD1 |
| ⋮ | ⋮ |

FIG.7

MEMORY DEVICE, SEMICONDUCTOR DEVICE, AND SEMICONDUCTOR SYSTEM

CROSS-REFERENCE TO RELATED APPLICATION

This application claims priority under 35 U.S.C. 119(a) to Korean patent application No. 10-2018-0019326, filed on Feb. 19, 2018, the disclosure of which is incorporated in its entirety by reference herein.

BACKGROUND OF THE INVENTION

Embodiments of the present disclosure relate to a memory device, a semiconductor device, and a semiconductor system, and more particularly, to a memory device for storing metadata, and a semiconductor device for performing a wear leveling operation using the metadata, and a semiconductor system for the memory device and the semiconductor device.

A memory device, such as a NAND flash memory device or a phase change memory device, has a limited number of write operations that can be executed in one cell. Therefore, if a large number of write operations are intensively applied to a specific cell region of the memory device, the lifetime of the memory device can be reduced. In order to address this issue, a wear leveling operation for allowing write operations to be evenly executed in the entire cell region of the memory device may be carried out.

In a process of performing a write request in the memory device, a logical address supplied from a host is mapped to a physical address of the memory device, and the write request is then performed in a cell region corresponding to the mapped physical address. The wear leveling operation may be carried out by changing mapping between a logical address and a physical address based on the number of write requests applied to a cell region corresponding to the physical address.

Conventionally, when a memory device includes a plurality of blocks, metadata including the number of write requests applied to the memory device has been managed in units of a block (i.e., on a block basis), and a wear leveling operation has been carried out based on metadata of each block. In the memory device, each block may include a plurality of pages, and each page may include a plurality of memory cells. Here, the page may be a basic unit of a write operation in the memory device.

However, when metadata are managed in units of a block in a memory device, it is difficult to recognize metadata per page, and thus there is a limit to improve performance of a wear leveling operation of the memory device.

BRIEF SUMMARY OF THE INVENTION

Various embodiments of the present disclosure are directed to providing a memory device, a semiconductor device, and a semiconductor system that substantially address one or more issues due to limitations and disadvantages of the related art.

An embodiment of the present disclosure relates to a memory device for storing metadata per page.

An embodiment of the present disclosure relates to a semiconductor device for performing a wear leveling operation using metadata per page, and a semiconductor system including the same.

In accordance with an embodiment of the present disclosure, a memory device includes a plurality of pages. Each page includes a data region configured to store data, an error correction code (ECC) region configured to store ECC data that is used to detect and correct one or more errors occurring in the data stored in the data region, and a metadata region configured to store a write count of a corresponding page.

In accordance with another embodiment of the present disclosure, a semiconductor device includes a decision circuit configured to generate an address storage signal with a predetermined probability, upon receiving a write request, an address storage circuit configured to store an address corresponding to the write request in response to the address storage signal, and an update circuit configured to update a page write count stored in a memory device, based on the address output from the address storage circuit.

In accordance with another embodiment of the present disclosure, a wear leveling device includes a block write count checking circuit configured to generate an all-meta read signal, based on a block write count of a specific block, a page write count acquisition circuit configured to acquire page write counts of pages included in the specific block corresponding to an input address from a memory device, in response to the all-meta read signal, and an address mapping change circuit configured to change address mapping between the input address and a physical address based on the page write counts.

In accordance with another embodiment of the present disclosure, a semiconductor system includes a memory device including a plurality of pages, and configured to store a page write count for each of the pages, and a semiconductor device configured to change address mapping between an input address and a physical address based on not only a block write count of a specific block corresponding to the input address, but also page write counts of pages included in the specific block.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein:

FIG. 7 illustrates an address mapping table contained in an address mapping circuit according to an embodiment of the present disclosure.

DESCRIPTION OF EMBODIMENTS

Reference will now be made in detail to the embodiments of the present disclosure, examples of which are illustrated in the accompanying drawings. The same or like reference numbers refer to the same or like parts throughout the various drawings and embodiments of the present disclosure.

Figure 1:
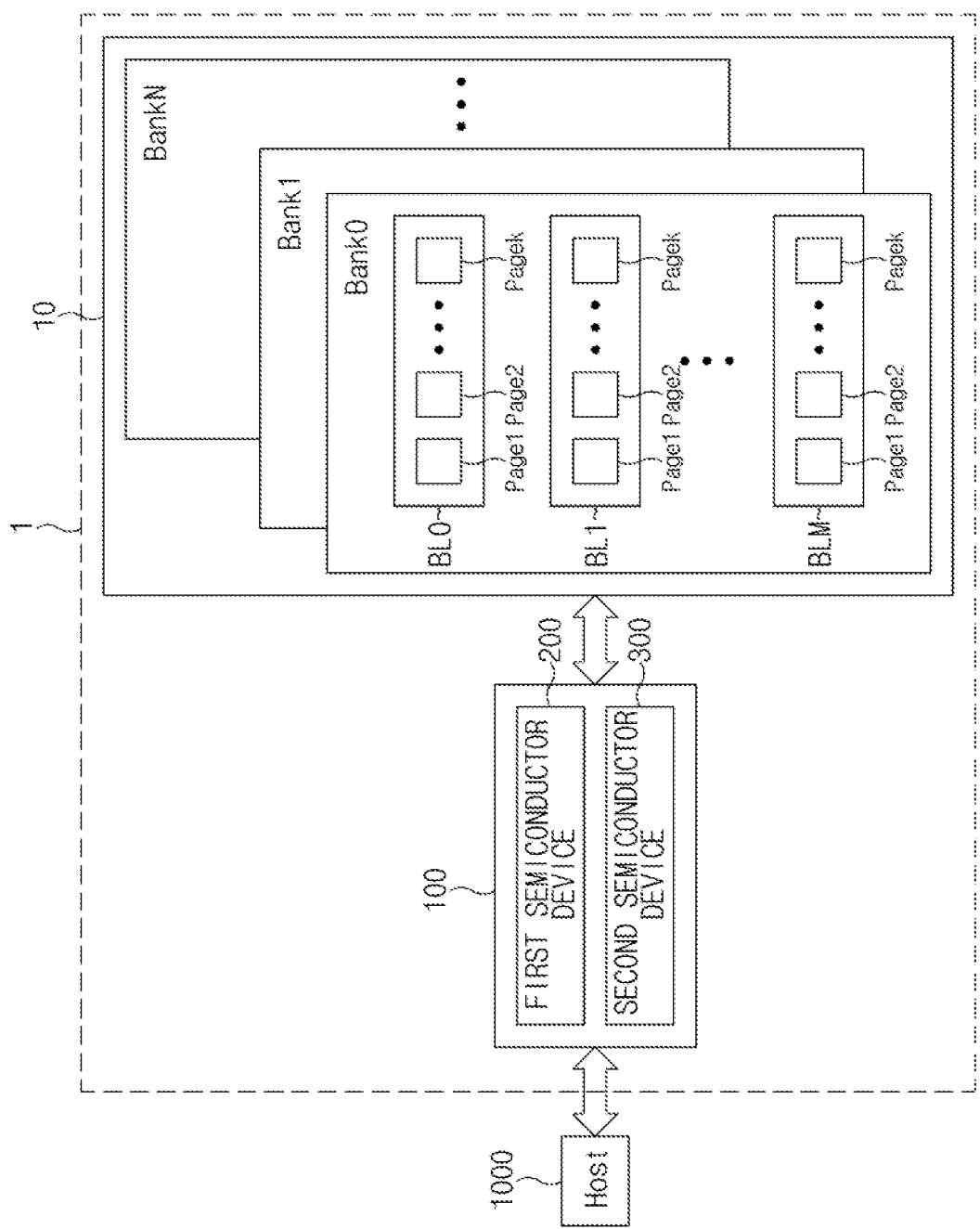
FIG. 1 illustrates a data processing system according to an embodiment of the present disclosure.

FIG. 1 illustrates a data processing system according to an embodiment of the present disclosure.

Referring to FIG. 1, the data processing system may include a host 1000 and a semiconductor system 1.

The host 1000 may include at least one operating system (OS). The operating system (OS) may support functions and operations corresponding to user's purposes, and may manage and control functions and operations of the host 1000. The operating system (OS) may allow the semiconductor system 1 and the host 1000 to interact with each other.

The semiconductor system 1 may include a memory device 10 and a semiconductor device 100. The memory device 10 may store data, and the semiconductor device 100 may control an operation for storing the data in the memory device 10. Although FIG. 1 illustrates the semiconductor device 100 and the memory device 10 that are separated from each other for convenience of description and better understanding of the present disclosure, the scope or spirit of the present disclosure is not limited thereto. In another embodiment, the semiconductor device 100 and the memory device 10 may be integrated into a single device.

The semiconductor device 100 may control the memory device 10 in response to a request from the host 1000. For example, the semiconductor device 100 may transmit data read from the memory device 10 to the host 1000, and may store write data received from the host 1000 in the memory device 10. The semiconductor device 100 may include a first semiconductor device 200, a second semiconductor device 300, or both.

In response to a read command, the memory device 10 may perform a read operation, such that data stored in the memory device 100 is output. In response to a write command, the memory device 10 may perform a write operation, such that write data is stored in the memory device 10. The memory device 10 may allow the stored data to remain unchanged even when power is shut off or interrupted. Although the memory device 10 may be implemented as a non-volatile memory such as a NAND flash memory or a phase change memory, the scope or spirit of the present disclosure is not limited thereto.

Referring to FIG. 1, the memory device 10 may include a plurality of banks Bank0~BankN, N being a positive integer. Each of the banks Bank0~BankN may include a plurality of blocks BL0~BLM, M being a positive integer. Each of the blocks BL0~BLM may include a plurality of pages Page1~PageK, K being a positive integer. Each of the banks Bank0~BankN may independently perform a read or write operation. Each of the pages Page1~PageK may include a plurality of memory cells, and may be used as a basic unit of the write operation. That is, in response to one write command, data may be stored in a data or metadata region corresponding to one page.

In FIG. 1, each of the banks Bank0~BankN may include the same number of blocks BL0~BLM, and each of the blocks BL0~BLM may include the same number of pages Page1~PageK. However, the scope or spirit of the present disclosure is not limited thereto. In other embodiments, the banks Bank0~BankN may include different numbers of blocks, and the blocks BL0~BLM may include different numbers of pages. In addition, the banks Bank0~BankN, the blocks BL0~BLM, and the pages Page1~PageK shown in FIG. 1 may be used to indicate the inclusion relationship or connection relationship, and may not correspond to physical arrangement as necessary.

Figure 2:
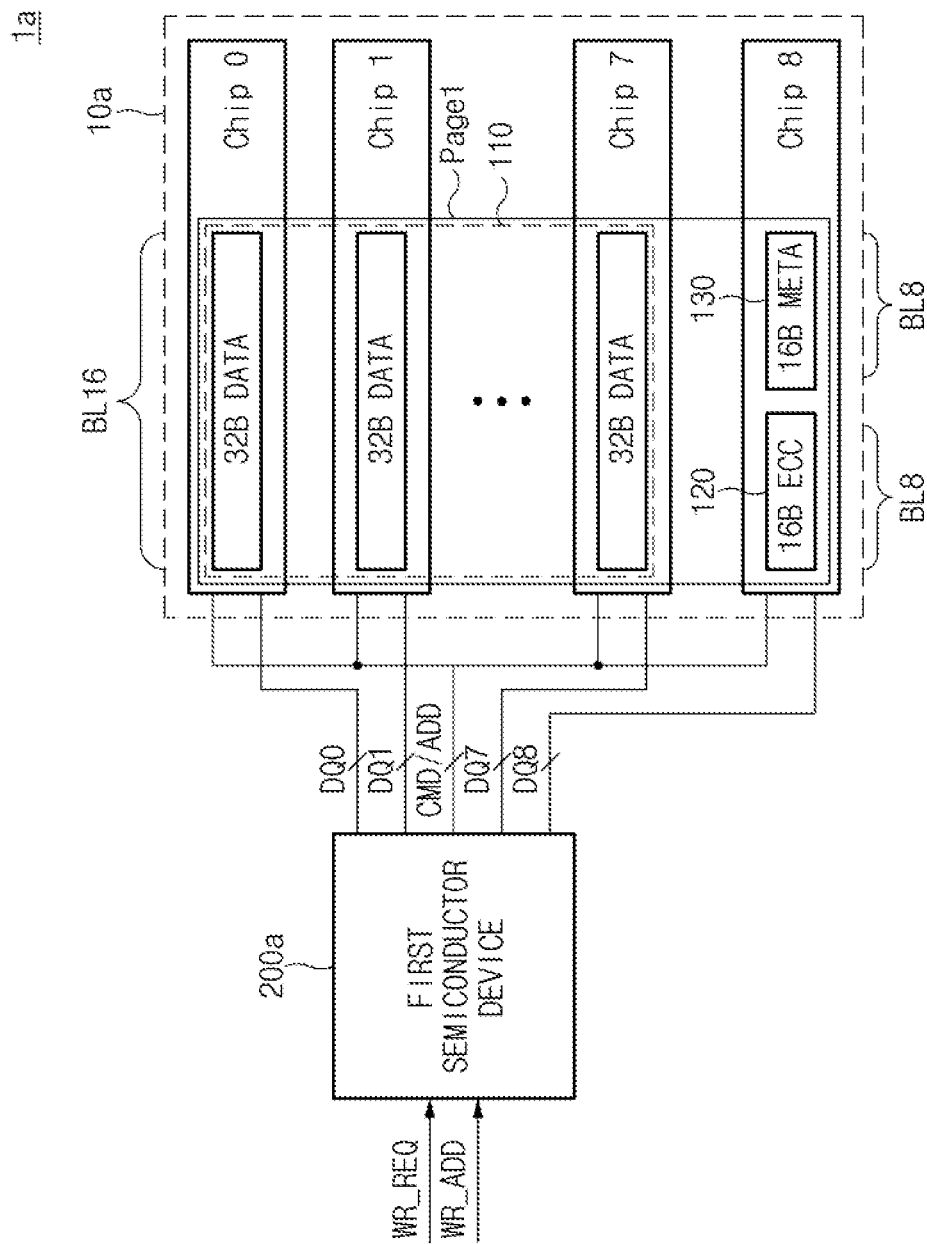
FIG. 2 illustrates a semiconductor system according to an embodiment of the present disclosure.

FIG. 2 illustrates a semiconductor system 1a according to an embodiment of the present disclosure.

Referring to FIG. 2, the semiconductor system 1a may include a memory device 10a and a semiconductor device 200a. The memory device 10a may correspond to the memory device 10 of FIG. 1. The semiconductor device 200a may correspond to the first semiconductor device 200 of FIG. 1. Although FIG. 2 illustrates the memory device 10a that includes only one page Page1 for convenience of description and better understanding of the present disclosure, the scope or spirit of the present disclosure is not limited thereto. In another embodiment, the memory device 10a may include a plurality of pages each having the same structure as the page Page1.

Referring to FIG. 2, the page Page1 may include a data region 110, an error correction code (ECC) region 120, and a metadata region 130. The data region 110, the ECC region 120, and the metadata region 130 may be classified according to types of data stored therein. The data region 110 may store data based on a write command. The ECC region 120 may store ECC data that is used to detect and correct errors occurring in the data stored in the data region 110. The metadata region 130 may store metadata that is used to manage one or more pages including the page Page1. For example, the metadata region 130 may store a page write count indicating the number of write requests applied to a page to which the metadata region 130 pertains.

The memory device 10a may include a plurality of semiconductor chips CHIP0~CHIP8. Referring to FIG. 2, the data region 110 may be disposed in the first to eighth semiconductor chips CHIP0~CHIP7. The ECC region 120 and the metadata region 130 may be disposed in the ninth semiconductor chip CHIP8. Although FIG. 2 illustrates the data region 110 that is disposed in the first to eighth semiconductor chips CHIP0~CHIP7 for convenience of description, the scope or spirit of the present disclosure is not limited thereto. In other embodiments, the number of semiconductor chips allocated to the data region 130 can be changed as necessary.

The first to eighth semiconductor chips CHIP0~CHIP7 may be coupled to a plurality of input/output (I/O) line sets DQ0~DQ7, respectively. Each of the I/O line sets DQ0~DQ7 may include, for example, 16 I/O lines. Each of the 16 I/O lines in each I/O line set may transmit data of 16 bits (16-bit data) in response to one read command or one write command. That is, each of the first to eighth semiconductor chips CHIP0~CHIP7 may operate with a burst length of 16 (BL16). As a result, during a read operation or a write operation corresponding to one read command or one write command, respectively, each of the semiconductor chip CHIP0~CHIP7 may output or receive data of 16×16 bits, i.e., data of 32 bytes (32-byte data), and the 8 semiconductor chips CHIP0~CHIP7 may output or receive data of 8×32 bytes, i.e., data of 256 bytes (256-byte data). In other words, according to this embodiment, the data region 110 corresponding to one page may have a length of 256 bytes, and each of the first to eighth semiconductor chips CHIP0~CHIP7 allocated to the data region 110 may store 32-byte data that corresponds to a portion of the data region 110. However, the size of the data region 110 and the size of the portion of the data region 110 in each semiconductor chip are not limited thereto, and may be changed according to the number of semiconductor chips storing data, the number of I/O lines allocated to each semiconductor chip, a burst length (BL), and the like.

As described above, the ECC region 120 and the metadata region 130 may be disposed in the ninth semiconductor chip CHIP8. That is, the ECC region 120 and the metadata region 130 may be disposed in the same chip. The ECC region 120 may be allocated to each page. The ECC region 120 may store ECC data corresponding to data stored in the data region 110 of the same page. When write data is stored in the data region 110 during the write operation, ECC data corresponding to the write data may be stored in the ECC region 120 of the same page. When read data is output from the data region 110 during the read operation, corresponding ECC data stored in the ECC region 120 may be output.

The metadata region 130 may be allocated to each page. The metadata region 130 may store a write count of a specific page to which the metadata region 130 pertains. The metadata region 130 may be accessed independently from the data region 110 and the ECC region 120 in the same page.

The I/O line set DQ8 coupled to the ninth semiconductor chip CHIP8 may have the same number of I/O lines (i.e., 16 I/O lines) as each of the first to eighth semiconductor chips CHIP0~CHIP7. The ECC region 120 and the metadata region 130 may operate with a burst length that is a half of the burst length of each of the first to eighth chips CHIP0~CHIP7. In accordance with this embodiment, each of the ECC region 120 and the metadata region 130 may operate with a burst length of 8 (BL8). Therefore, when a read operation or a write operation is performed in each of the ECC region 120 and the metadata region 130, ECC data of 16 bytes (8×16 bits) or page metadata of 16 bytes (8×16 bits) may be input or output. In other words, the ECC region 120 of one page may store 16-byte ECC data, and the metadata region 130 of one page may store 16-byte metadata.

During a write operation, write data may be stored in the data region 110 in each of the first to eighth semiconductor chips CHIP0~CHIP7, and at the same time corresponding ECC data may be stored in the ECC region 120 in the ninth semiconductor chip CHIP8. As described above, write data of 256 bytes (i.e., 256-byte write data) may be stored in the data region 110, and corresponding ECC data of 16 bytes (i.e., 16-byte ECC data) may be stored in the ECC region 120.

During a read operation, read data may be output from the data region 110 in each of the first to eighth semiconductor chips CHIP0~CHIP7, and at the same time corresponding ECC data may be output from the ECC region 120 in the ninth semiconductor chip CHIP8. In the same manner as in the write operation, data of 256 bytes (i.e., 256-byte read data) may be output from the data region 110, and corresponding ECC data of 16 bytes (i.e., 16-byte ECC data) may be output from the ninth semiconductor chip CHIP8. As described above, during the write operation or the read operation, the data region 110 and the ECC region 120 may be simultaneously accessed. The metadata region 130 may be accessed independently from the data region 110 and the ECC region 120.

Figure 3:
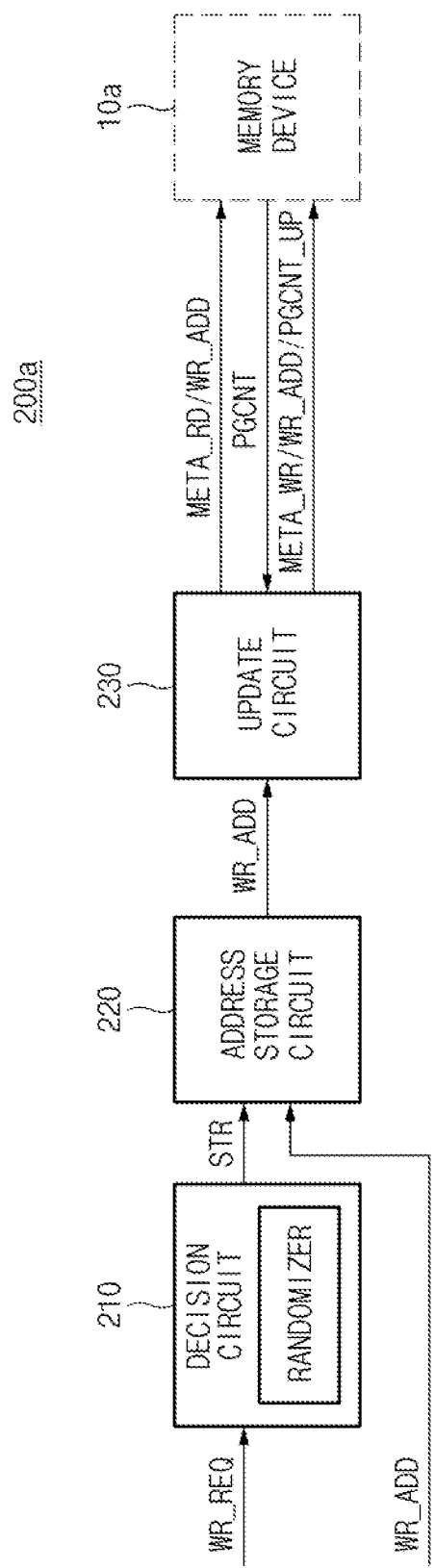
FIG. 3 illustrates a semiconductor device according to an embodiment of the present disclosure.

FIG. 3 illustrates the semiconductor device 200a shown in FIG. 2 according to an embodiment of the present disclosure.

Referring to FIG. 3, the semiconductor device 200a may include a decision circuit 210, an address storage circuit 220, and an update circuit 230.

Upon receiving a write request WR_REQ, the decision circuit 210 may decide whether to store an address WR_ADD corresponding to the write request WR_REQ. In this embodiment, a write operation of a semiconductor system may be performed in units of a page. Therefore, the address WR_ADD corresponding to the write request WR_REQ may be a page address indicating a specific page of the memory device 10a. Whenever the decision circuit 210 receives a write request WR_REQ, the decision circuit 210 may store a page address WR_ADD corresponding to the received write request WR_REQ in the address storage circuit 220. In this case, the address storage circuit 220 may unavoidably increase in size to store the page address WR_ADD whenever the write request WR_REQ is received, and the number of times that the semiconductor device 200a accesses the metadata region 130 in the memory device 10a may also increase.

Therefore, in accordance with an embodiment, upon receiving a write request WR_REQ, the decision circuit 210 may store a page address WR_ADD with a predetermined probability. To do this, the decision circuit 210 may include a randomizer. For example, the randomizer may generate a random number from among 1 to 16, the random number corresponding to the predetermined probability. If a specific number from among the 1 to 16 is generated as the random number, an address storage signal STR may be activated, such that the decision circuit 210 may store the page address WR_ADD with a probability of 1/16.

The address storage circuit 220 may store the page address WR_ADD in response to the activated address storage signal STR. The address storage circuit 220 may have a First In First Out (FIFO) structure or a Last In First Out (LIFO) structure, or may output the page address WR_ADD irrespective of a data input order.

Upon receiving the page address WR_ADD from the address storage circuit 220, the update circuit 230 may update the number of write requests applied to each page of the memory device 10a. In other words, the update circuit 230 may update a page write count PGCNT upon receiving the page address WR_ADD. The page write count PGCNT may be stored in the metadata region 130 of a page corresponding to the page address WR_ADD. In accordance with an embodiment, the update circuit 230 may read the page write count PGCNT that is stored in the metadata region 130, update the page write count PGCNT, and write an updated page write count PGCNT_UP in the metadata region 130, such that the update circuit 230 can store a write count per page.

Figure 4:
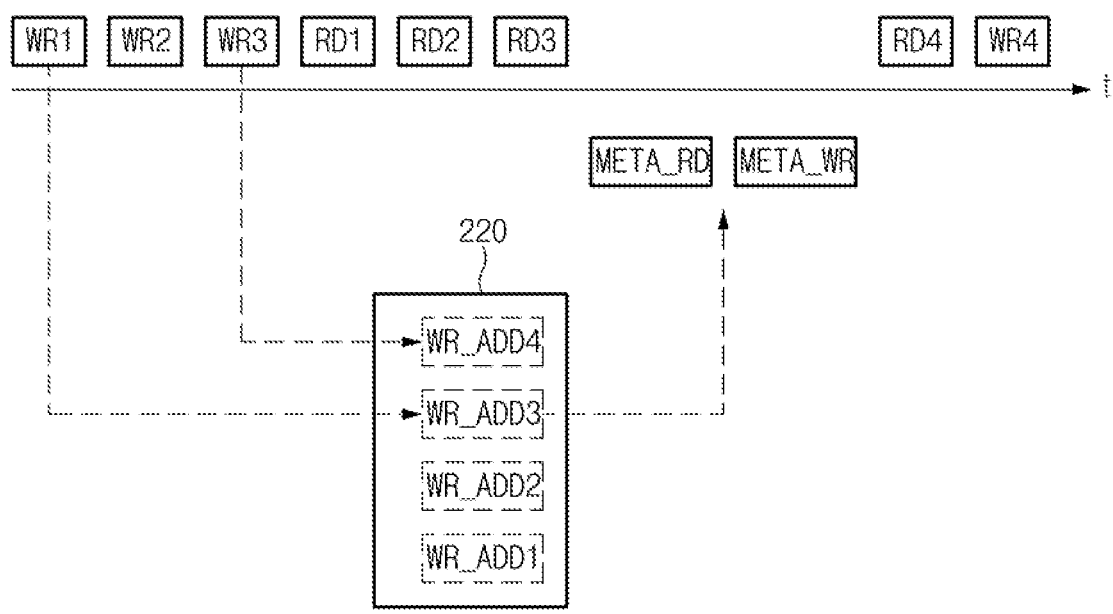
FIG. 4 illustrates a method for updating a page write count according to an embodiment of the present disclosure.

FIG. 4 illustrates a method for updating a page write count according to an embodiment of the present disclosure. The method of FIG. 4 may be performed by the semiconductor device 200a shown in FIG. 3. Therefore, the method of FIG. 4 will be described with reference to FIGS. 2 and 3.

Referring to FIG. 4, write commands WR1~WR4 may be commands for performing a write operation for the data region 110 and the ECC region 120, and read commands RD1~RD4 may be commands for performing a read operation for the data region 110 and the ECC region 120. A meta write command META_WR may be a command for performing a write operation for the metadata region 130, and a meta read command META_RD may be a command for performing a read operation for the metadata region 130.

Referring to FIG. 4, the write commands WR1, WR2, and WR3, the read commands RD1, RD2, and RD3, the meta read command META_RD, the meta write command META_WR, the read command RD4, and the write command WR4 may be sequentially transmitted to the memory device 10*a*. As described above, the meta read command META_RD or the meta write command META_WR for the metadata region 130 may be transmitted to the memory device 10*a* while a general read command, such as the read command RD1, RD2, RD3, or RD4, a general write command, such as the write command WR1, WR2, WR3, or WR4, is not input to the memory device 10*a*.

The decision circuit 210 of the semiconductor device 200*a* may decide whether to store a page address corresponding to each of the write commands WR1, WR2, and WR3. Whether to store a page address corresponding to each of the commands WR1, WR2, and WR3 is decided with a probability of 1/16. In this embodiment shown in FIG. 4, it is assumed that the address storage circuit 220 stores the page addresses corresponding to the write commands WR1 and WR3 as page addresses WR_ADD3 and WR_ADD4, respectively.

When the memory device 10*a* is in a standby mode, i.e., when the memory device 10*a* does not receive the general read command or the general write command, the update circuit 230 may transmit the meta read command META_RD for a page address stored in the address storage circuit 220 to the memory device 10*a*. In response to the meta read command META_RD, the memory device 10*a* may transmit page metadata (i.e., a page write count) stored in the metadata region 130 to the update circuit 230. The update circuit 230 may increase a value of the received page write count by one, and may transmit the meta write command META_WR for writing the increased page write count to the memory device 10*a*. The memory device 10*a* may write the increased page write count in the metadata region 130 in response to the meta write command META_WR.

The update circuit 230 may update a page write count of a random address selected from among a plurality of page addresses stored in the address storage circuit 220. For example, if page addresses WR_ADD1, WR_ADD2, WR_ADD3, and WR_ADD4 are sequentially stored in the address storage circuit 220 as shown in FIG. 4, a page write count corresponding to the random page address WR_ADD3 may be updated first. However, the scope or spirit of the present disclosure is not limited thereto. In another embodiment, a page write count of the firstly-stored page address WR_ADD1 may be updated first, or a page write count of the finally-stored page address WR_ADD4 may be updated first.

Figure 5:
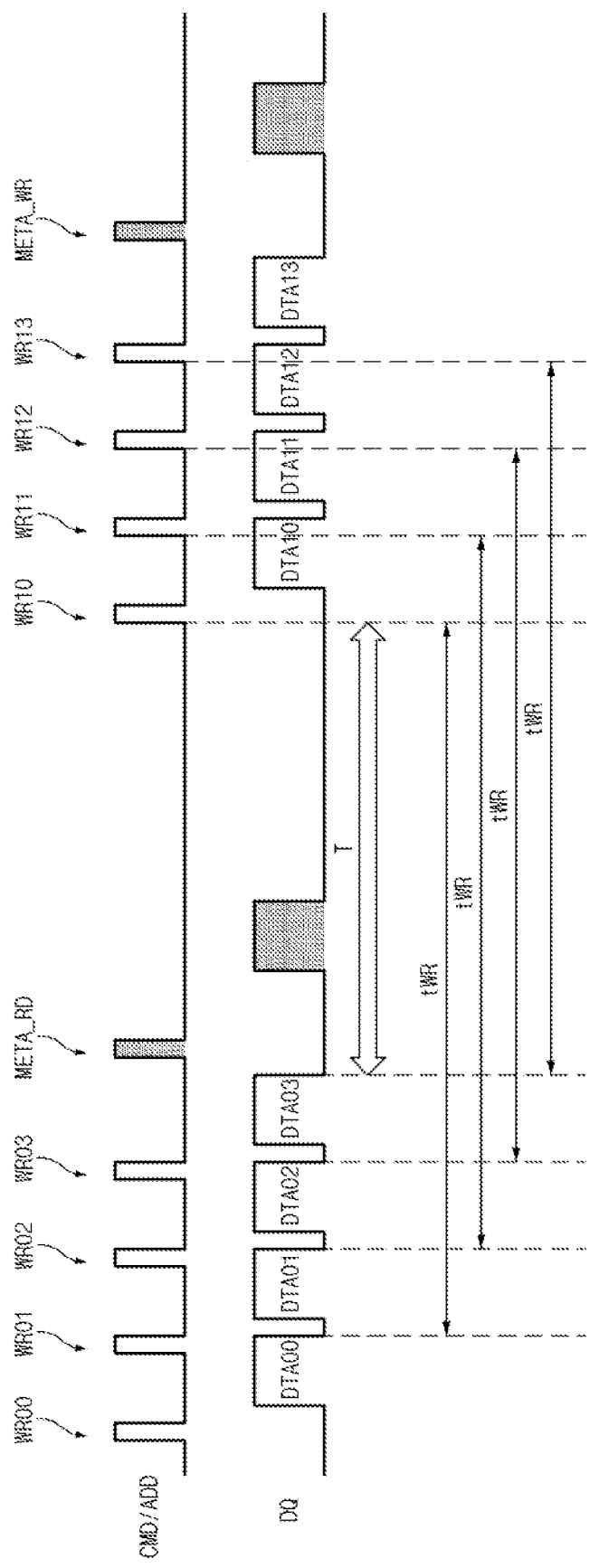
FIG. 5 is a timing diagram illustrating a method for updating metadata according to an embodiment of the present disclosure.

FIG. 5 is a timing diagram illustrating a method for updating metadata according to an embodiment of the present disclosure. The method of FIG. 5 will be described with reference to the semiconductor system 1*a* shown in FIGS. 2 and 3.

In recent times, the number of industrial fields in which processing of a large amount of data, such as image processing or big data processing, is needed is rapidly increasing. In order to process a large amount of data, increasing a data processing rate is of importance. As a representative example of a method for increasing a data processing rate of a semiconductor memory device, bank interleaving technology is being used. The bank interleaving technology may refer to data control technology capable of simultaneously using a plurality of banks. However, since the bank interleaving technology simultaneously uses the plurality of banks, power consumption may unavoidably increase. As a result, the number of write operations capable of being simultaneously executed or the number of read operations capable of being simultaneously executed may be restricted, such that a standby time may occur in a memory device when the memory device performs a maximum number of write operations or a maximum number of read operations.

For convenience of description, it is assumed that a memory device, e.g., the memory device 10*a*, performing the method of FIG. 5 includes four banks Bank0~Bank3. However, the scope or spirit of the present disclosure is not limited thereto.

Referring to FIG. 5, a write command WR00 for the first bank Bank0 and data DTA00 corresponding to the write command WR00, a write command WR01 for the second bank Bank1 and data DTA01 corresponding to the write command WR01, a write command WR02 for the third bank Bank2 and data DTA02 corresponding to the write command WR02, and a write command WR03 for the fourth bank Bank3 and data DTA03 corresponding to the write command WR03 may be sequentially applied to the memory device 10*a*. After lapse of a predetermined time, a write command WR10 for the first bank Bank0 and data DTA10 corresponding to the write command WR10, a write command WR11 for the second bank Bank1 and data DTA11 corresponding to the write command WR11, a write command WR12 for the third bank Bank2 and data DTA12 corresponding to the write command WR12, and a write command WR13 for the fourth bank Bank3 and data DTA13 corresponding to the write command WR13 may be sequentially applied to the memory device 10*a*.

After the write command WR00 for the first bank Bank0 and the data DTA00 corresponding to the write command WR00 are applied to the memory device 10*a*, a write operation for the first bank Bank0 may be carried out during a predetermined time tWR. In the same manner as in the first bank Bank0, after the write commands WR01~WR03 and the data DTA01~DTA03 respectively corresponding to the write commands WR01~WR03 are input to the memory device 10*a*, a write operation for each of the banks Bank1~Bank3 may be carried out during the predetermined time tWR.

Since an amount of power capable of being consumed in the memory device 10*a* is limited, the number of write or read commands capable of being simultaneously processed in the memory device 10*a* may be limited. Although the maximum number of write commands capable of being simultaneously processed in the memory device 10*a* according to this embodiment is exemplarily set to 4 for convenience of description, the scope or spirit of the present disclosure is not limited thereto. In accordance with this embodiment, although the number of banks Bank0~Bank3 is identical to the maximum number of write commands capable of being simultaneously processed in the memory device 10*a* for convenience of description, it should be noted that the number of banks may be different from the maximum number of write commands capable of being simultaneously processed as necessary.

During a predetermined period of time T shown in FIG. 5, write operations may be carried out in the four banks Bank0~Bank3 according to the maximum number of simultaneously processable write commands. Therefore, no additional write command may be input to the memory device 10a during the predetermined period of time T. After lapse of the predetermined period of time T, when the write operation for the first bank Bank0 is completed, the write command WR10 for the first bank Bank0 and the data DTA10 corresponding to the write command WR10 may be input to the memory device 10a. After the write operation for the second bank Bank1 is completed, the write command WR11 for the second bank Bank1 and the data DTA11 corresponding to the write command WR11 may be input to the memory device 10a. After the write operation for the third bank Bank2 is completed, the write command WR12 for the third bank Bank2 and the data DTA12 corresponding to the write command WR12 may be input to the memory device 10a. After the write operation for the fourth bank Bank3 is completed, the write command WR13 for the fourth bank Bank3 and the data DTA13 corresponding to the write command WR13 may be input to the memory device 10a.

During activation of the maximum number of banks in a bank interleaving mode, the semiconductor device 200a according to this embodiment may store or update a page write count. That is, during the standby period of time T in which any write command is not input to the memory device 10a, the semiconductor device 200a may store or update the page write count therein. In order to update the page write count, the semiconductor device 200a should read a previous page write count stored in the metadata region 130, increase the previous page write count by one, and finally write the increased page write count in the metadata region 130.

Generally, an amount of power to be consumed in a read operation may be less than an amount of power to be consumed in a write operation. In addition, the metadata region 130 corresponding to a single page is 16 bytes long and the single page is 256 bytes long. Thus, the metadata region 130 may be smaller in size than the single page. Therefore, although a read operation or a write operation for updating the page write count is performed during the activation of the maximum number of banks, i.e., during the standby period of time T, an amount of power to be additionally consumed in the memory device 10a for the read and write operations to update the page write count may not be large enough to cause any issue in the write operations of the memory device 10a. In accordance with this embodiment, since the page write count can be updated during the activation of the maximum number of banks in the bank interleaving mode, a separate period of time for updating the page write count need not be allocated to the semiconductor system 1a. As a result, performance of the semiconductor system 1a may be prevented from being deteriorated due to the updating of the page write count.

A semiconductor device configured to perform a wear leveling operation using the above-mentioned metadata (i.e., page write count) will hereinafter be described with reference to the attached drawings.

Figure 6:
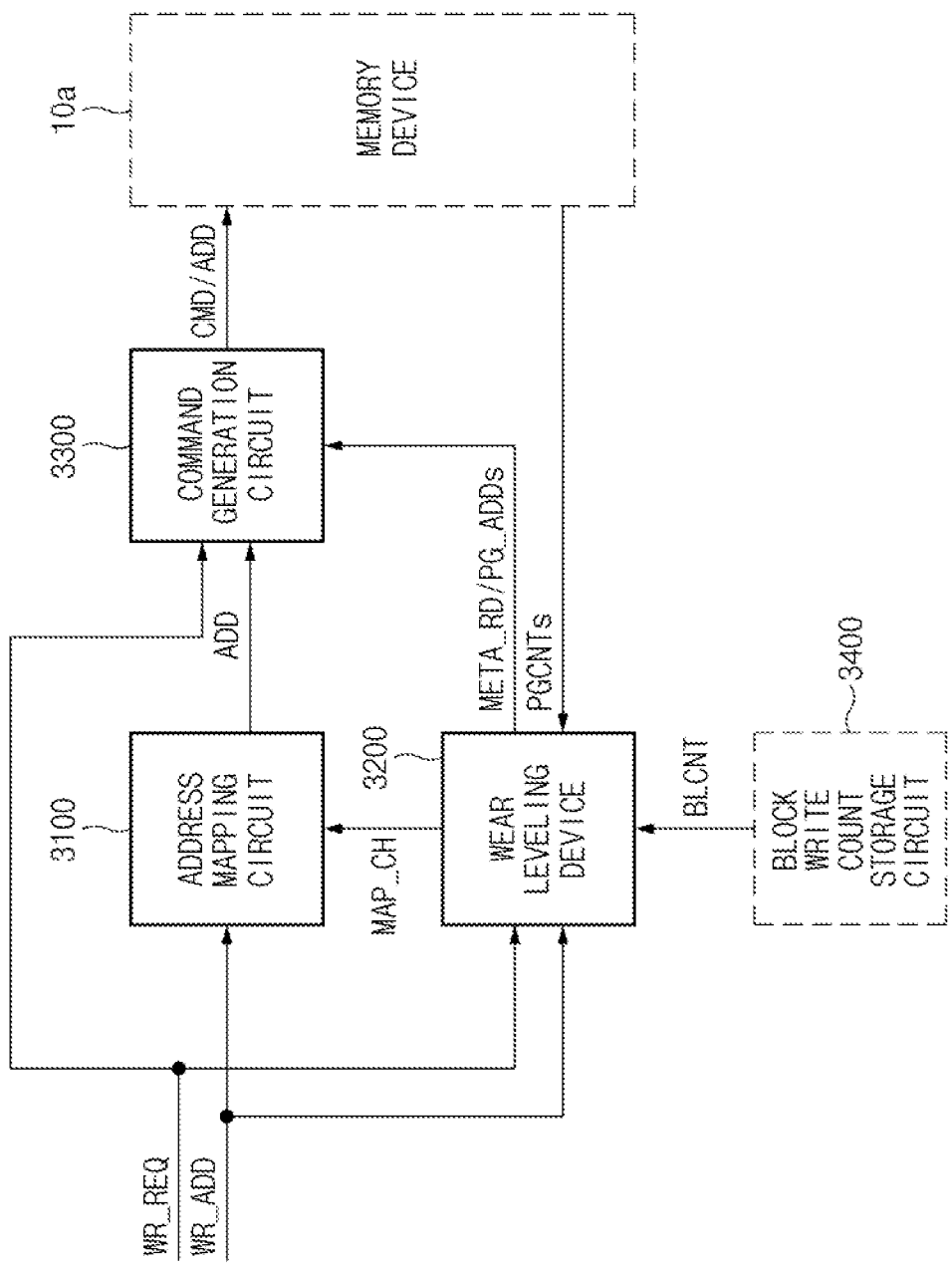
FIG. 6 illustrates a semiconductor device according to an embodiment of the present disclosure.

FIG. 6 illustrates a semiconductor device 300a according to an embodiment of the present disclosure. The semiconductor device 300a may correspond to the second semiconductor device 300 of FIG. 1. Referring to FIG. 6, the semiconductor device 300a may generate a command CMD upon receiving a write request WR_REQ and an address WR_ADD from the host 1000 of FIG. 1, or may generate a command CMD for reading page write counts PGCNTs from the memory device 10a, and may then perform a wear leveling operation.

The semiconductor device 300a may include an address mapping circuit 3100, a wear leveling device 3200, and a command generation circuit 3300. The address mapping circuit 3100 may map an address WR_ADD corresponding to a logical address to a physical address ADD, and may change the address mapping between the logical address WR_ADD and the physical address ADD in response to an address mapping change signal MAP_CH.

In response to the write request WR_REQ, the wear leveling device 3200 may generate page addresses PG_ADDs and a meta read command META_RD that are needed to acquire the page write counts PGCNTs from the memory device 10a, and may then generate the address mapping change signal MAP_CH for changing address mapping of the address mapping circuit 3100.

In response to the write request WR_REQ and the physical address ADD from the address mapping circuit 3100, the command generation circuit 3300 may generate a command CMD, e.g., a write command WR, and an address ADD that are to be transmitted to the memory device 10a. In accordance with the embodiment, upon receiving the meta read command META_RD and the page addresses PG_ADDs from the wear leveling device 3200, the command generation circuit 330 may generate a command CMD and addresses ADD respectively corresponding to the meta read command META_RD and the page addresses PG_ADDs to read the page write counts PGCNTs from the metadata region 130 of the memory device 10a.

FIG. 7 illustrates a page address mapping table contained in the address mapping circuit 3100 of FIG. 6 according to an embodiment of the present disclosure.

Referring to FIG. 7, the page address mapping table may indicate not only logical page addresses LOG_ADD1 and LOG_ADD2, but also physical page addresses PHY_ADD1, PHY_ADD2, and PHY_ADD3 corresponding to the logical page addresses LOG_ADD1 and LOG_ADD2. An address WR_ADD received along with a write request WR_REQ may be a logical address, and an address ADD generated by the address mapping circuit 3100 may be a physical address. As illustrated in FIG. 7, an address mapping between logical page addresses and physical page addresses in a page address mapping table AMT1 may be different from an address mapping between logical page addresses and physical page addresses in a page address mapping table AMT2. The address mapping circuit 3100 may include the page address mapping tables AMT1 and AMT2 which are different in correlation between the logical page addresses and the physical page addresses from each other, and may change a page address mapping table to be used in response to the address mapping change signal MAP_CH.

In accordance with another embodiment, the address mapping circuit 3100 may convert the logical page address WR_ADD into the physical page address ADD using an exclusive-OR (XOR) key. If a value of the XOR key is set to K, the following equations 1 and 2 may be achieved.

$$A \text{ XOR } K = B \qquad \text{[Equation 1]}$$

$$A = B \text{ XOR } K \qquad \text{[Equation 2]}$$

For example, if A is set to zero "0" and K is set to "1," a value of B denoted by (A XOR K) becomes "1." In Equations 1 and 2, if B is set to "1" and K is set to "1," a value of A denoted by (B XOR K) becomes "0.".

Based on the above-mentioned characteristics of the XOR operations, it may be possible for a logical page address LOG_ADD and a physical page address PHY_ADD to correlate with each other. If the physical page address PHY_ADD, the logical page address LOG_ADD, and the XOR key have the same number of bits, the following equations 3 and 4 may be achieved. The XOR operation may be performed in each of the corresponding bits.

$$LOG\_ADD\ XOR\ K = PHY\_ADD \quad [\text{Equation 3}]$$

$$LOG\_ADD = PHY\_ADD\ XOR\ K \quad [\text{Equation 4}]$$

In the case of using the above-mentioned XOR key, each pair of the physical page address PHY_ADD and the logical page address LOG_ADD need not be stored, and only the value of the XOR key needs to be stored, such that a storage region needed for storing a page address map may be reduced in size. In accordance with the embodiment, the address mapping change signal MAP_CH may denote the value of the XOR key, and the address mapping circuit 3100 may convert a physical page address PHY_ADD into a logical page address LOG_ADD according to the address mapping change signal MAP_CH that denotes the XOR key value.

In accordance with still another embodiment, not only a scheme based on the address mapping table, but also a scheme based on the XOR key may be applied to the address mapping circuit 3100 as necessary. The address mapping change signal MAP_CH may indicate not only a target address mapping table to be changed, but also a target XOR key to be changed.

Figure 8:
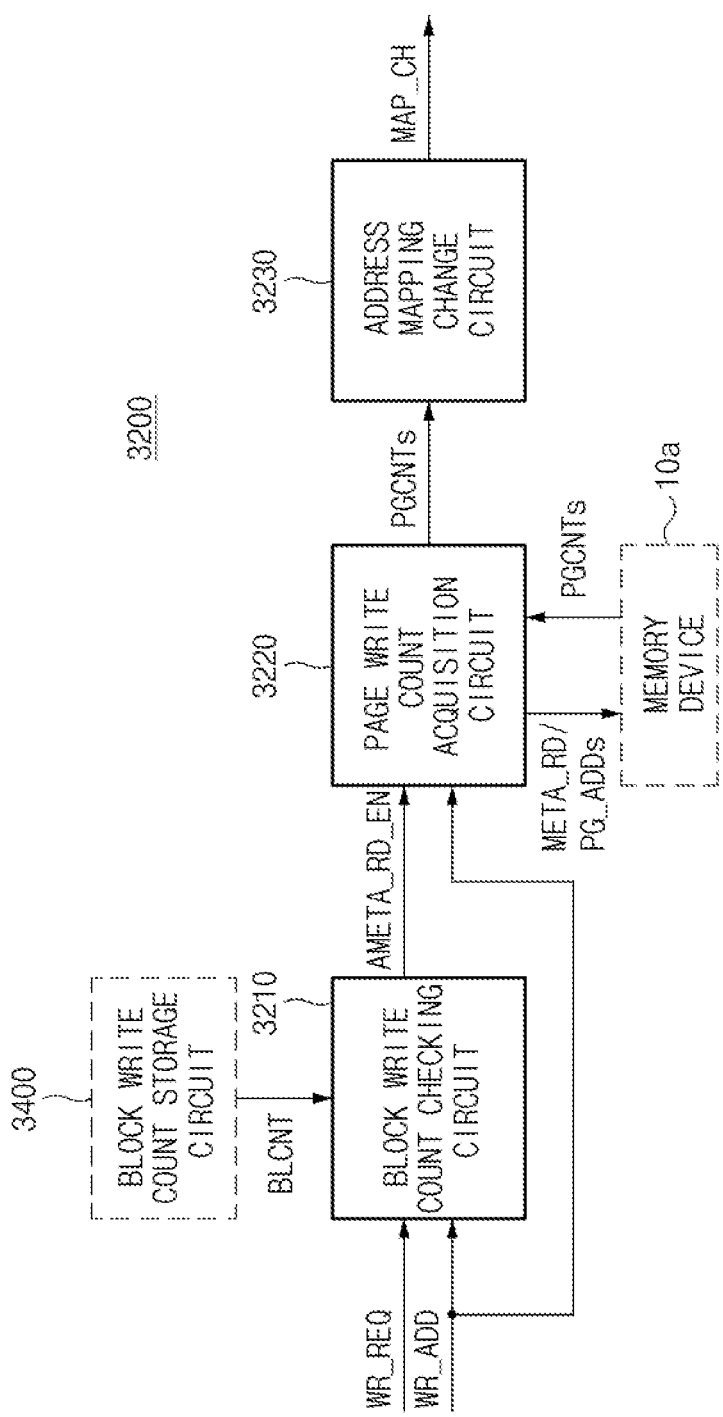
FIG. 8 illustrates a wear leveling device according to an embodiment of the present disclosure.

FIG. 8 illustrates the wear leveling device 3200 of FIG. 6 according to an embodiment of the present disclosure.

Referring to FIG. 8, the wear leveling device 3200 may include a block write count checking circuit 3210, a page write count acquisition circuit 3220, and an address mapping change circuit 3230.

Upon receiving the write request WR_REQ, the block write count checking circuit 3210 may acquire a block write count BLCNT of a specific block corresponding to the received write request WR_REQ from a block write count storage circuit 3400, and may generate an all-meta read signal AMETA_RD_EN based on the acquired block write count BLCNT. Here, the block write count BLCNT may refer to the number of write operations having been executed in pages included in the specific block.

In response to the all-meta read signal AMETA_RD_EN, the page write count acquisition circuit 3220 may acquire page write counts PGCNTs of the pages included in the specific block corresponding to the write request WR_REQ. To acquire the page write counts PGCNTs, the page write count acquisition circuit 3220 may transmit not only the meta read command META_RD, but also addresses PG_ADDs of the pages included in the specific block corresponding to the write request WR_REQ to the memory device 10a through the command generation circuit 3300 shown in FIG. 6. The memory device 10a may read the page write counts PGCNTs from the metadata region 130 based on the meta read command META_RD and the page addresses PG_ADDs.

The address mapping change circuit 3230 may generate the address mapping change signal MAP_CH to change page address mapping based on the page write counts PGCNTs. The address mapping change signal MAP_CH may be a first signal for changing an address mapping table, may be a second signal for indicating an XOR key, or may indicate both the first signal for changing the address mapping table and the second signal for indicating the XOR key.

In accordance with an embodiment, the address mapping change circuit 3230 may generate the address mapping change signal MAP_CH based on a difference between a maximum value and a minimum value from among the page write counts PGCNTs. For example, if the difference between the maximum value and the minimum value from among the page write counts PGCNTs is less than a predetermined reference value, the address mapping change circuit 3230 may deactivate the address mapping change signal MAP_CH. If the difference between the maximum value and the minimum value from among the page write counts PGCNTs is equal to or greater than the predetermined reference value, the address mapping change circuit 3230 may activate the address mapping change signal MAP_CH. In more detail, if the difference between the maximum value and the minimum value from among the page write counts PGCNTs is less than the predetermined reference value, this means that a write operation has been evenly executed in the pages included in the specific block. If the difference between the maximum value and the minimum value from among the page write counts PGCNTs is equal to or greater than the predetermined reference value, this means that the write operation has been unevenly executed in the pages included in the specific block.

Figure 9:
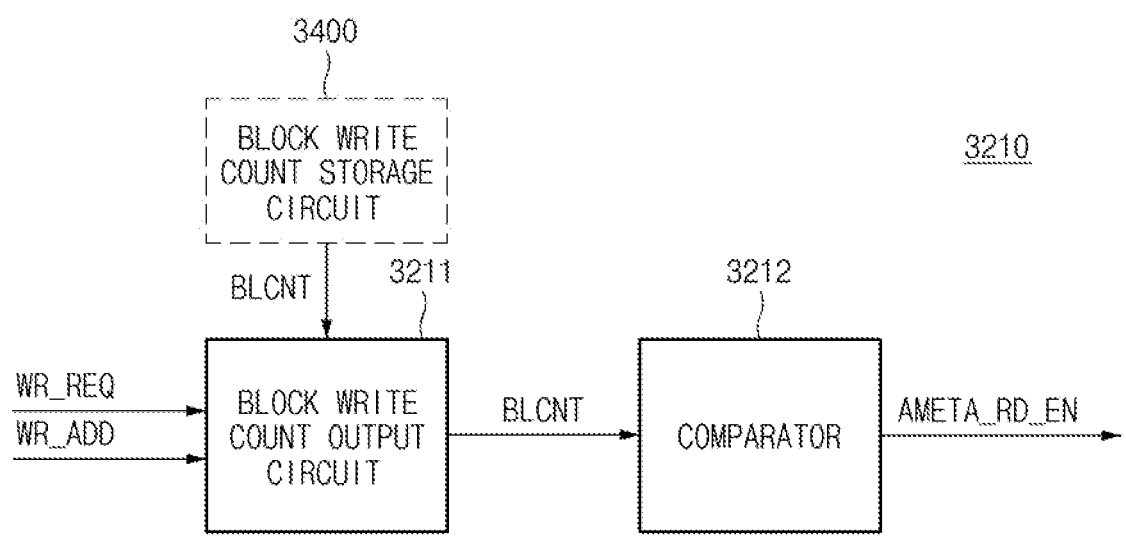
FIG. 9 illustrates a block write count checking circuit according to an embodiment of the present disclosure.

FIG. 9 illustrates the block write count checking circuit 3210 of FIG. 8 according to an embodiment of the present disclosure. Referring to FIG. 9, the block write count checking circuit 3210 may include a block write count output circuit 3211 and a comparator 3212.

The block write count output circuit 3211 may receive the block write count BLCNT from the block write count storage circuit 3400 configured to store the block write count BLCNT. The block write count storage circuit 3400 may be a memory device configured to store metadata associated with a block. For example, the block write count storage circuit 3400 may be a dynamic random access memory (DRAM). In accordance with an embodiment, the block write count storage circuit 3400 may be included in the block write count output circuit 3211.

Upon receiving the write request WR_REQ, the block write count output circuit 3211 may acquire the block write count BLCNT from the block write count storage circuit 3400, and may output the acquired block write count BLCNT. In response to the write request WR_REQ, the block write count output circuit 3211 may generate a read signal to read the block write count BLCNT from the block write count storage circuit 3400.

The comparator 3212 may generate the all-meta read signal AMETA_RD_EN based on a result of comparison between the block write count BLCNT received from the block write count output circuit 3211 and a predetermined reference value. For example, when the block write count BLCNT is equal to or greater than the predetermined reference value, the comparator 3212 may generate the all-meta read signal AMETA_RD_EN.

Figure 10:
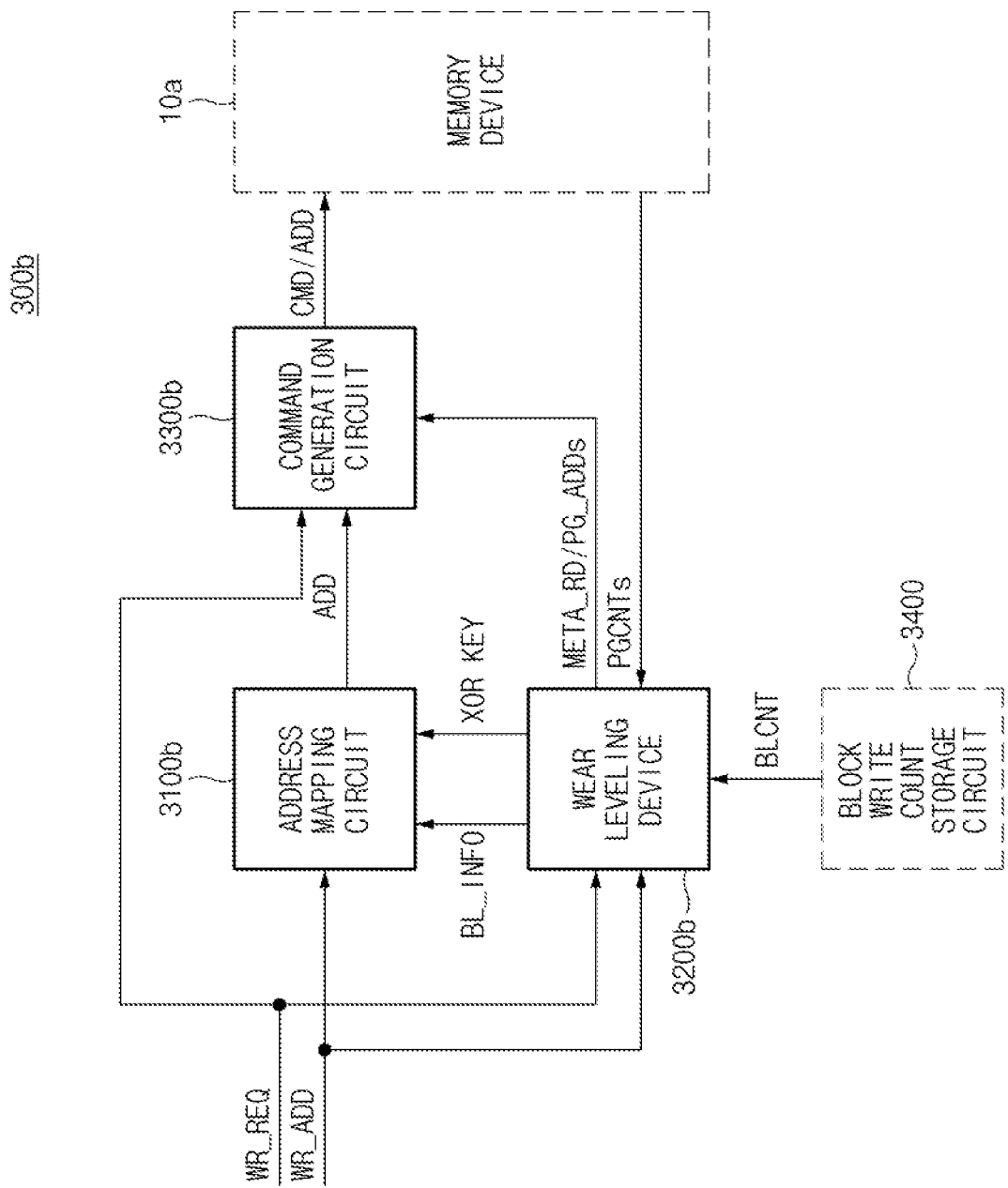
FIG. 10 illustrates a semiconductor device according to an embodiment of the present disclosure.

FIG. 10 illustrates a semiconductor device 300b according to an embodiment of the present disclosure. The semiconductor device 300b may correspond to the second semiconductor device 300 of FIG. 1.

Referring to FIG. 10, the semiconductor device 300b may include an address mapping circuit 3100b, a wear leveling device 3200b, and a command generation circuit 3300b. The address mapping circuit 3100b may select one of a plurality of address mapping tables based on block section information BL_INFO, may perform address conversion (or address mapping), and may re-convert the converted address using an XOR key. The wear leveling device 3200b may provide the block section information BL_INFO and the XOR key based on the write request WR_REQ. The command generation circuit 3300b is identical in function to the command generation circuit 3300 of FIG. 6. Therefore, a detailed description for the command generation circuit 3300b will be omitted for convenience of description.

Figure 11:
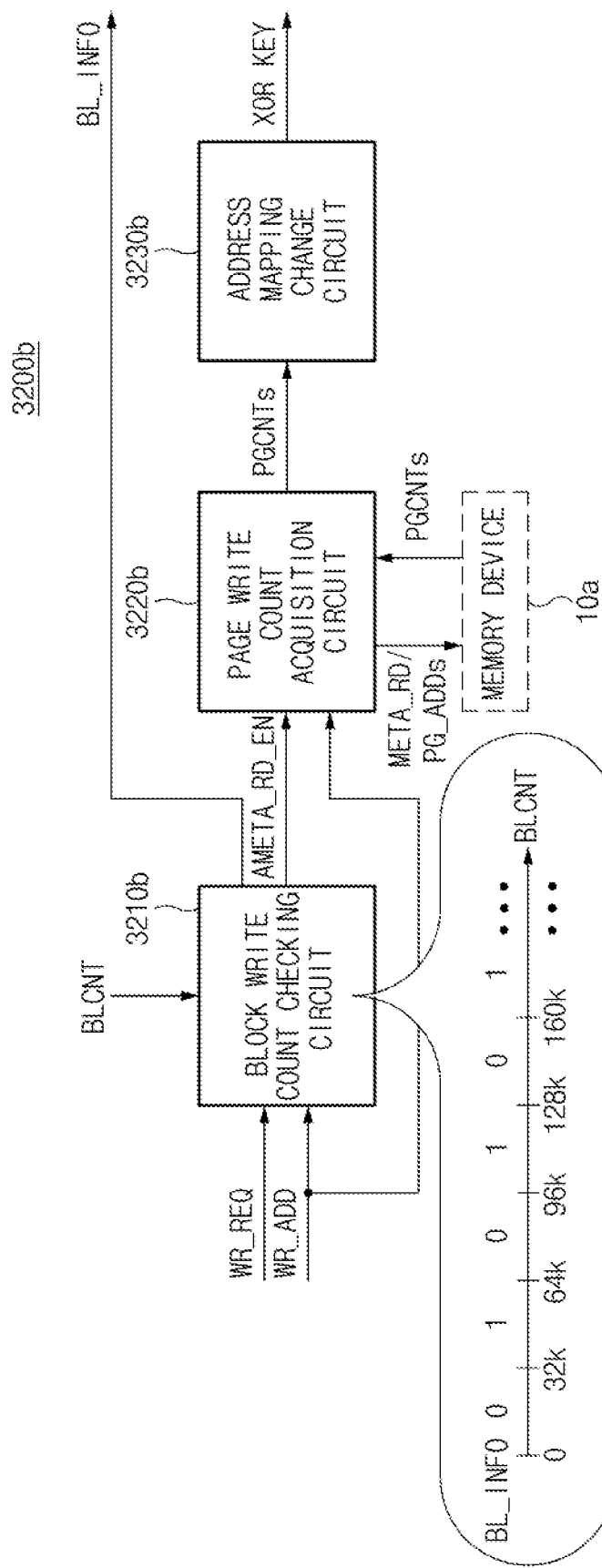
FIG. 11 illustrates a wear leveling device according to an embodiment of the present disclosure.

FIG. 11 illustrates the wear leveling device 3200b of FIG. 10 according to an embodiment of the present disclosure.

Referring to FIG. 11, the wear leveling device 3200b may include a block write count checking circuit 3210b, a page write count acquisition circuit 3220b, and an address mapping change circuit 3230b.

In the same manner as in the block write count checking circuit 3210 of FIG. 8, when the block write count checking circuit 3210b receives the write request WR_REQ, the block write count checking circuit 3210b may generate the all-meta read signal AMETA_RD_EN based on a block write count BLCNT of a specific block corresponding to the received write request WR_REQ. In addition, the block write count checking circuit 3210b may determine which one of predetermined sections corresponds to a block write count of each block of the memory device 10a, and may generate the block section information BL_INFO based on the determined section.

Referring to FIG. 11, the block write count checking circuit 3210b may set a plurality of predetermined sections to which a block write count BLCNT may belong, at intervals of a predetermined number of times (for example, 32K). That is, the plurality of predetermined sections to which block write counts belong are set to represent a number of write operations having been performed in each block. The block write count checking circuit 3210b may generate block section information BL_INFO corresponding to each section. For example, when a block write count of a block of the memory device 10a is located in the section of 0~32K, the block write count checking circuit 3210b may output "0" as the block section information BL_INFO. When a block write count of a block of the memory device 10a is located in the section of 32K~64K, the block write count checking circuit 3210b may output "1" as the block section information BL_INFO. When a block write count of a block of the memory device 10a is located in the section of 64K~96K, the block write count checking circuit 3210b may output "0" as the block section information BL_INFO.

The page write count acquisition circuit 3220b of FIG. 11 is identical in function to the page write count acquisition circuit 3220 of FIG. 8. Therefore, a detailed description for the page write count acquisition circuit 3220b will be omitted for convenience of description.

The address mapping change circuit 3230b may generate an XOR key for changing address mapping based on the page write counts PGCNTs read out from the memory device 10a. In particular, the address mapping change circuit 3230b may generate the XOR key based on a difference between a minimum value and a maximum value from among the page write counts PGCNTs.

Figure 12:
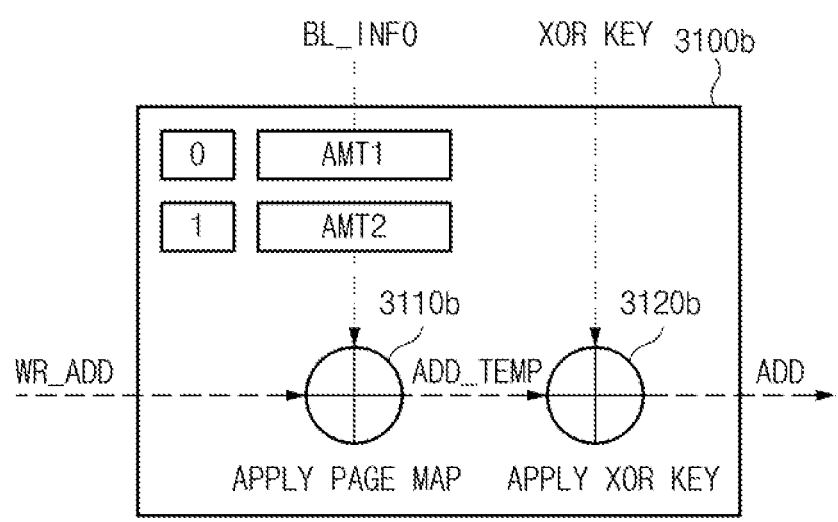
FIG. 12 illustrates operations of an address mapping circuit according to an embodiment of the present disclosure.

FIG. 12 illustrates operations of the address mapping circuit 3100b of FIG. 10 according to an embodiment of the present disclosure. In this embodiment, the address mapping circuit 3100b may include an address mapping table applying circuit 3110b and an XOR key applying circuit 3120b.

The address mapping table applying circuit 3110b may select one of a plurality of address mapping tables based on the block section information BL_INFO. For example, if the block section information is set to "0," i.e., if the block write count is located in the section of 0~32K, the address mapping table applying circuit 3110b may perform conversion of a logical address WR_ADD to a physical address ADD using an address mapping table AMT1 to thereby generate a temporary address ADD_TEMP. On the other hand, if the block section information is set to "1," i.e., if the block write count is located in the section of 32K~64K, the address mapping table applying circuit 3110b may perform conversion of the logical address WR_ADD to the physical address ADD using an address mapping table AMT2 to thereby generate the temporary address ADD_TEMP.

After that, the XOR key applying circuit 3120b may generate the physical address ADD by applying the XOR key to the temporary address ADD_TEMP.

In accordance with an embodiment, the address mapping circuit 3100b may re-generate the address mapping tables AMT1 and AMT2 based on the block section information BL_INFO. For example, the address mapping circuit 3100b may re-generate the address mapping tables AMT1 and AMT2 whenever the block section information BL_INFO is changed from "1" to "0."

Although this embodiment has assumed that each of the block write count sections has the same size of 32K for convenience of description, the scope or spirit of the present disclosure is not limited thereto, and the block write count sections may also have different sizes as necessary.

Although this embodiment has assumed that the block section information BL_INFO has two values "0" and "1" and two address mapping tables AMT1 and AMT2 corresponding to the two values "0" and "1," respectively, for convenience of description, the scope or spirit of the present disclosure is not limited thereto. In another embodiment, the block section information BL_INFO may have four values "00," "01," "10," and "11" to represent different sections, e.g., 0~32K, 32K~64K, 64K~96K, and 96K~128K, respectively, such that the number of address mapping tables corresponding to these four block section information may be set to 4. In still another embodiment, instead of mapping the block section information BL_INFO to each of the address mapping tables on a one to one basis, if the block section information BL_INFO is classified into "00" or "10," the block section information BL_INFO may be configured to correspond to the address mapping table AMT1. If the block section information BL_INFO is classified into "01" or "11," the block section information BL_INFO may be configured to correspond to the address mapping table AMT2. In this way, one address mapping table may correspond to two or more values of the block section information BL_INFO.

In accordance with an embodiment, the address mapping table is first applied to the address mapping circuit 3100b and the XOR key is then applied to the address mapping circuit 3100b for convenience of description, the scope or spirit of the present disclosure is not limited thereto. In another embodiment, the XOR key is first applied to the address mapping circuit 3100b and the address mapping table is then applied to the address mapping circuit 3100b as necessary.

In accordance with an embodiment, the address mapping table may be applied to a block, and different XOR keys are applied to pages in the block, resulting in improvement in wear leveling performance. In the case of using only the XOR key, the value of the XOR key may be limited only to the scope of available values allocated to either the physical page address or the logical page address. For example, assuming that the physical page address or the logical page address is composed of 4 bits, the XOR key may also be 4 bits long. Therefore, the number of available values allocated to the XOR key may be limited to 16.

In the case of using the address mapping table, the physical addresses should be paired with the individual logical addresses, such that the size of a storage space may unavoidably increase. In accordance with this embodiment, the same address mapping table is applied to a block and different XOR keys are applied to pages in the block, such that the storage space needed for wear leveling can be reduced in size and the wear leveling performance can be improved.

As is apparent from the above description, the embodiment of the present disclosure may store metadata per page.

The embodiment of the present disclosure may increase the lifetime of a semiconductor device by improving performance of wear leveling.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor system comprising:
   a memory device including a plurality of pages and configured to store a page write count for each of the plurality of pages; and
   a semiconductor device configured to change address mapping between an input address and a physical address based on a block write count of a specific block corresponding to the input address and the page write counts of pages included in the specific block,
   wherein each of the plurality of pages includes:
   a data region configured to store data;
   an error correction code (ECC) region configured to store ECC data that is used to detect and correct one or more errors occurring in the data stored in the data region; and
   a metadata region configured to store a page write count of a corresponding page, and
   wherein the semiconductor device generates block section information indicating which one of predetermined sections corresponds to the block write count of the specific block and changes the address mapping based on the block section information, and
   wherein the metadata region is accessed independently from the data region and the ECC region by the semiconductor device.

2. The semiconductor system according to claim 1, wherein:
   the data region is disposed in a plurality of first semiconductor chips;
   the ECC region and the metadata region are disposed in a second semiconductor chip; and
   a size of the data region disposed in each of the first semiconductor chips is identical to a sum of a size of the ECC region disposed in the second semiconductor chip and a size of the metadata region disposed in the second semiconductor chip.

3. The semiconductor system according to claim 2, wherein:
   each of the size of the ECC region and the size of the metadata region is half the size of the data region disposed in each of the first semiconductor chips.

4. The semiconductor system according to claim 2, wherein:
   a burst length of the second semiconductor chip is half a burst length of each of the first semiconductor chips.

5. The semiconductor system according to claim 1, wherein the semiconductor device comprises:
   a wear leveling device configured to generate the block section information and an address mapping change signal; and
   an address mapping circuit configured to change the address mapping based on the block section information and the address mapping change signal,
   wherein the wear leveling device includes:
   a block write count checking circuit configured to generate an all-meta read signal based on the block write count of the specific block and to generate the block section information;
   a page write count acquisition circuit configured to acquire the page write counts of the pages included in the specific block in response to the all-meta read signal; and
   an address mapping change circuit configured to generate an address mapping change signal based on the page write counts.

6. The semiconductor system according to claim 5, wherein the address mapping circuit includes a plurality of address mapping tables, selects one of the plurality of address mapping tables based on the block section information, and maps the input address to a corresponding address using the selected address mapping table.

7. The semiconductor system according to claim 6, wherein:
   the address mapping circuit generates an XOR key as the address mapping change signal; and
   the address mapping circuit applies the XOR key to the corresponding address to thereby output the physical address mapped to the input address.

* * * * *